(12) United States Patent
Parkhe

(10) Patent No.: US 10,973,088 B2
(45) Date of Patent: Apr. 6, 2021

(54) OPTICALLY HEATED SUBSTRATE SUPPORT ASSEMBLY WITH REMOVABLE OPTICAL FIBERS

(71) Applicant: Applied Materials, Inc., Santa Clara, CA (US)

(72) Inventor: Vijay D. Parkhe, San Jose, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 538 days.

(21) Appl. No.: 15/485,124

(22) Filed: Apr. 11, 2017

(65) Prior Publication Data

US 2017/0303338 A1 Oct. 19, 2017

Related U.S. Application Data

(60) Provisional application No. 62/324,042, filed on Apr. 18, 2016.

(51) Int. Cl.
*H05B 3/00* (2006.01)
*H01L 21/67* (2006.01)
(Continued)

(52) U.S. Cl.
CPC ....... *H05B 3/0047* (2013.01); *C23C 16/4581* (2013.01); *C23C 16/4583* (2013.01); *C23C 16/46* (2013.01); *C23C 16/481* (2013.01); *G01K 11/32* (2013.01); *G02B 6/3644* (2013.01); *H01L 21/67103* (2013.01); *H01L 21/67115* (2013.01); *H01L 21/67248* (2013.01);
(Continued)

(58) Field of Classification Search
CPC . C23C 16/4581; C23C 16/4583; C23C 16/46; C23C 16/481; G01K 11/32; G02B 6/00; G02B 6/3644; H01L 21/67103; H01L 21/76115; H01L 21/762448; H01L 21/6831; H01L 21/6833; H05B 1/0233; H05B 3/0047
See application file for complete search history.

(56) References Cited

U.S. PATENT DOCUMENTS 4,662,368 A 5/1987 Hussein et al.
4,702,547 A 10/1987 Enochs
(Continued)

FOREIGN PATENT DOCUMENTS

CN 101112939 A 1/2008
CN 101118795 A 2/2008
(Continued)

OTHER PUBLICATIONS

PCT International Search Report for PCT/US2017/027247 dated Sep. 26, 2017, 3 pages.
(Continued)

*Primary Examiner* — Justin C Dodson
*Assistant Examiner* — Dilnessa B Belay
(74) *Attorney, Agent, or Firm* — Lowenstein Sandler LLP

(57) ABSTRACT

A substrate support includes a plate comprising a top surface and a bottom surface, wherein the top surface is to support a substrate. The plate further comprises an electrode, one or more resistive heating elements, a first plurality of channels, and a plurality of optical fibers in the first plurality of channels, wherein the plurality of optical fibers are removable from the substrate support.

18 Claims, 9 Drawing Sheets

(51) Int. Cl.
  *H01L 21/683* (2006.01)
  *C23C 16/46* (2006.01)
  *C23C 16/458* (2006.01)
  *C23C 16/48* (2006.01)
  *G01K 11/32* (2006.01)
  *G02B 6/36* (2006.01)
  *H05B 1/02* (2006.01)
  *G02B 6/42* (2006.01)

(52) U.S. Cl.
  CPC ...... *H01L 21/6831* (2013.01); *H01L 21/6833* (2013.01); *H05B 1/0233* (2013.01); *G02B 6/3636* (2013.01); *G02B 6/4298* (2013.01)

(56) References Cited

U.S. PATENT DOCUMENTS

| | | | |
|---|---|---|---|
| 4,994,060 A | 2/1991 | Rink et al. | |
| 5,140,220 A | 8/1992 | Hasegawa | |
| 5,363,458 A | 11/1994 | Pan et al. | |
| 5,425,831 A | 6/1995 | Grimes et al. | |
| 5,500,556 A | 3/1996 | Kosugi | |
| 5,616,261 A | 4/1997 | Forrest | |
| 5,699,461 A | 12/1997 | Minemoto et al. | |
| 6,080,965 A | 6/2000 | Osawa | |
| 6,319,321 B1 | 11/2001 | Hiraga et al. | |
| 6,406,179 B2 | 6/2002 | Adams et al. | |
| 6,490,146 B2 | 12/2002 | Wang et al. | |
| 6,535,685 B1 | 3/2003 | Tullis | |
| 6,538,872 B1 | 3/2003 | Wang et al. | |
| 6,642,484 B2 | 11/2003 | Eggert et al. | |
| 6,646,235 B2 | 11/2003 | Chen et al. | |
| 6,740,853 B1 | 5/2004 | Johnson et al. | |
| 6,818,864 B2 | 11/2004 | Ptak | |
| 7,190,862 B1 | 3/2007 | Peterson | |
| 7,519,252 B2 | 4/2009 | Morita | |
| 7,560,007 B2* | 7/2009 | Gaff | G01K 11/20 156/345.27 |
| 8,226,769 B2 | 7/2012 | Matyushkin et al. | |
| 8,461,674 B2 | 6/2013 | Gaff et al. | |
| 8,546,732 B2 | 10/2013 | Singh | |
| 8,587,113 B2 | 11/2013 | Gaff et al. | |
| 8,624,168 B2 | 1/2014 | Gaff et al. | |
| 8,637,794 B2 | 1/2014 | Singh et al. | |
| 8,663,391 B2 | 3/2014 | Matyushkin et al. | |
| 8,884,194 B2 | 11/2014 | Singh et al. | |
| 8,937,800 B2 | 1/2015 | Lubomirsky et al. | |
| 9,196,514 B2* | 11/2015 | Parkhe | H01L 21/67109 |
| 9,224,583 B2* | 12/2015 | Povolny | C23C 16/4586 |
| 2002/0179585 A1 | 12/2002 | Maltabes et al. | |
| 2003/0062359 A1 | 4/2003 | Ho et al. | |
| 2007/0000441 A1 | 1/2007 | Lue | |
| 2008/0017104 A1* | 1/2008 | Matyushkin | H05B 3/0047 118/696 |
| 2008/0019657 A1 | 1/2008 | Maitland et al. | |
| 2008/0039000 A1 | 2/2008 | Bennett et al. | |
| 2008/0247739 A1 | 10/2008 | Sohtome | |
| 2008/0251019 A1 | 10/2008 | Krishnaswami et al. | |
| 2009/0111276 A1 | 4/2009 | Dhindsa et al. | |
| 2010/0267173 A1 | 10/2010 | Moffatt | |
| 2011/0005686 A1 | 1/2011 | Tanaka et al. | |
| 2011/0024047 A1 | 2/2011 | Nguyen et al. | |
| 2012/0211933 A1* | 8/2012 | Goto | H01L 21/67248 269/293 |
| 2013/0065011 A1 | 3/2013 | Suzuki et al. | |
| 2013/0081447 A1 | 4/2013 | Carter et al. | |
| 2013/0126509 A1 | 5/2013 | He et al. | |
| 2013/0161305 A1 | 6/2013 | Ptasienski et al. | |
| 2013/0220989 A1 | 8/2013 | Pease et al. | |
| 2014/0045337 A1 | 2/2014 | Singh et al. | |
| 2014/0047705 A1 | 2/2014 | Singh et al. | |
| 2014/0048529 A1 | 2/2014 | Pease | |
| 2014/0096909 A1 | 4/2014 | Singh et al. | |
| 2014/0133799 A1 | 5/2014 | Yasuda et al. | |
| 2014/0154819 A1 | 6/2014 | Gaff et al. | |
| 2014/0263177 A1* | 9/2014 | Povolny | H01J 37/32935 216/55 |
| 2015/0070814 A1* | 3/2015 | Parkhe | H01L 21/67248 361/234 |
| 2015/0129165 A1 | 5/2015 | Parkhe et al. | |
| 2015/0155193 A1 | 6/2015 | Hsu et al. | |
| 2015/0170977 A1 | 6/2015 | Singh | |
| 2015/0187625 A1 | 7/2015 | Busche et al. | |
| 2015/0187626 A1 | 7/2015 | Parkhe et al. | |
| 2015/0228513 A1 | 8/2015 | Parkhe et al. | |
| 2015/0311105 A1 | 10/2015 | Sadjadi et al. | |
| 2015/0357228 A1 | 12/2015 | Busche et al. | |
| 2015/0364354 A1 | 12/2015 | Tantiwong et al. | |
| 2015/0366004 A1 | 12/2015 | Nangoy et al. | |
| 2016/0007411 A1 | 1/2016 | Busche et al. | |
| 2016/0027678 A1 | 1/2016 | Parkhe et al. | |

FOREIGN PATENT DOCUMENTS

| | | | | |
|---|---|---|---|---|
| CN | 102792442 A1 | 11/2012 | | |
| EP | 0458388 A1 | 11/1991 | | |
| JP | H06-009187 U | 2/1994 | | |
| JP | H09-148258 A | 6/1997 | | |
| JP | H09-186095 A | 7/1997 | | |
| JP | 2003-161845 A1 | 6/2003 | | |
| JP | 2003-172850 A | 6/2003 | | |
| JP | WO2013162000 A1 | 10/2013 | | |
| JP | 2014-095800 A | 5/2014 | | |
| JP | WO2013162000 | * 10/2014 | ......... C32C 16/4581 | |
| KR | 10-2007-0096958 | 10/2007 | | |
| KR | 200448307 Y1 | 3/2010 | | |
| WO | 2013162000 A1 | 10/2013 | | |
| WO | WO-2013162000 A1 * | 10/2013 | ............. C23C 16/46 | |

OTHER PUBLICATIONS

PCT Written Opinion of the International Searching Authority for PCT/US2017/027247 dated Sep. 26, 2017, 9 pages.
Chinese Search Report of Chinese Application No. 201580034345.1 dated Aug. 20, 2018.
Taiwan Search Report of Taiwan Application No. 104120017 dated Aug. 20, 2018.

* cited by examiner

OPTICALLY HEATED SUBSTRATE SUPPORT ASSEMBLY WITH REMOVABLE OPTICAL FIBERS

RELATED APPLICATIONS

This patent application claims the benefit under 35 U.S.C. § 119(e) of U.S. Provisional Application No. 62/324,042, filed Apr. 18, 2016, which is herein incorporated by reference.

TECHNICAL FIELD

Embodiments of the present invention relate to an apparatus for controlling substrate temperature using optical heating.

BACKGROUND

Conventional electronic device manufacturing systems may include one or more process chambers. In some electronic device manufacturing systems, the one or more process chambers may be arranged around a mainframe housing having a transfer chamber and one or more load lock chambers. These systems may employ one or more process chambers that may perform a process on a substrate (e.g., a wafer) inserted into the process chamber. Processing may include a chemical vapor deposition (CVD) process, such as plasma-enhanced chemical vapor deposition (PECVD) process, used to deposit a thin film on a substrate or other high-temperature process. During processing, wafers may rest on a pedestal (e.g., a substrate support) and the temperature thereof may be controlled (e.g., heated or cooled) at one or more times during the process. Conventionally, heating may be provided by resistive heaters provided within the pedestal in some embodiments.

It should be recognized, however, that even small variations in temperature across the substrate during such high-temperature processing may cause differential processing (e.g., possibly uneven deposition).

SUMMARY

In one aspect, a substrate support includes a plate comprising a top surface and a bottom surface, wherein the top surface is to support a substrate. The plate further comprises an electrode, one or more resistive heating elements, a first plurality of channels, and a plurality of optical fibers in the first plurality of channels, wherein the plurality of optical fibers are removable from the substrate support.

In another aspect, a substrate support assembly includes a ceramic plate comprising a top surface and a bottom surface, wherein the top surface is to support a substrate, the ceramic plate further comprising a first plurality of channels for receiving a plurality of optical fibers. The substrate support assembly further includes a ceramic shaft bonded to the bottom surface of the ceramic plate, the ceramic shaft comprising a cavity. The substrate support assembly further includes a fiber guide inserted into the cavity of the ceramic shaft, the fiber guide comprising a second plurality of channels, wherein a second channel of the second plurality of channels is to guide a first optical fiber of the plurality of optical fibers into a first channel of the first plurality of channels.

In another aspect, a substrate support assembly includes a ceramic plate comprising a top surface and a bottom surface, wherein the top surface is to support a substrate, the ceramic plate further comprising a first plurality of channels for receiving a plurality of optical fibers. The substrate support assembly further includes a ceramic shaft bonded to the bottom surface of the ceramic plate, the ceramic shaft comprising a cavity and a second plurality of channels, wherein a second channel of the second plurality of channels is to guide a first optical fiber of the plurality of optical fibers into a first channel of the first plurality of channels.

In another aspect, a method of refurbishing an electrostatic chuck includes identifying a faulty optical fiber in the electrostatic chuck comprising a plurality of removable optical fibers, wherein each of the plurality of removable optical fibers is inside of one of a first plurality of channels in the electrostatic chuck. The method further includes removing the faulty optical fiber from a first channel of the first plurality of channels in the electrostatic chuck, wherein the first channel is substantially parallel to a top surface of the electrostatic chuck. The method further includes inserting a new optical fiber into the first channel in the electrostatic chuck.

Numerous other aspects are provided in accordance with these and other embodiments of the invention. Other features and aspects of embodiments of the present invention will become more fully apparent from the following description, the appended claims, and the accompanying drawings.

BRIEF DESCRIPTION OF THE DRAWINGS

Embodiments of the present invention are illustrated by way of example, and not by way of limitation, in the figures of the accompanying drawings in which like references indicate similar elements.

DETAILED DESCRIPTION OF EMBODIMENTS

Figure 1:
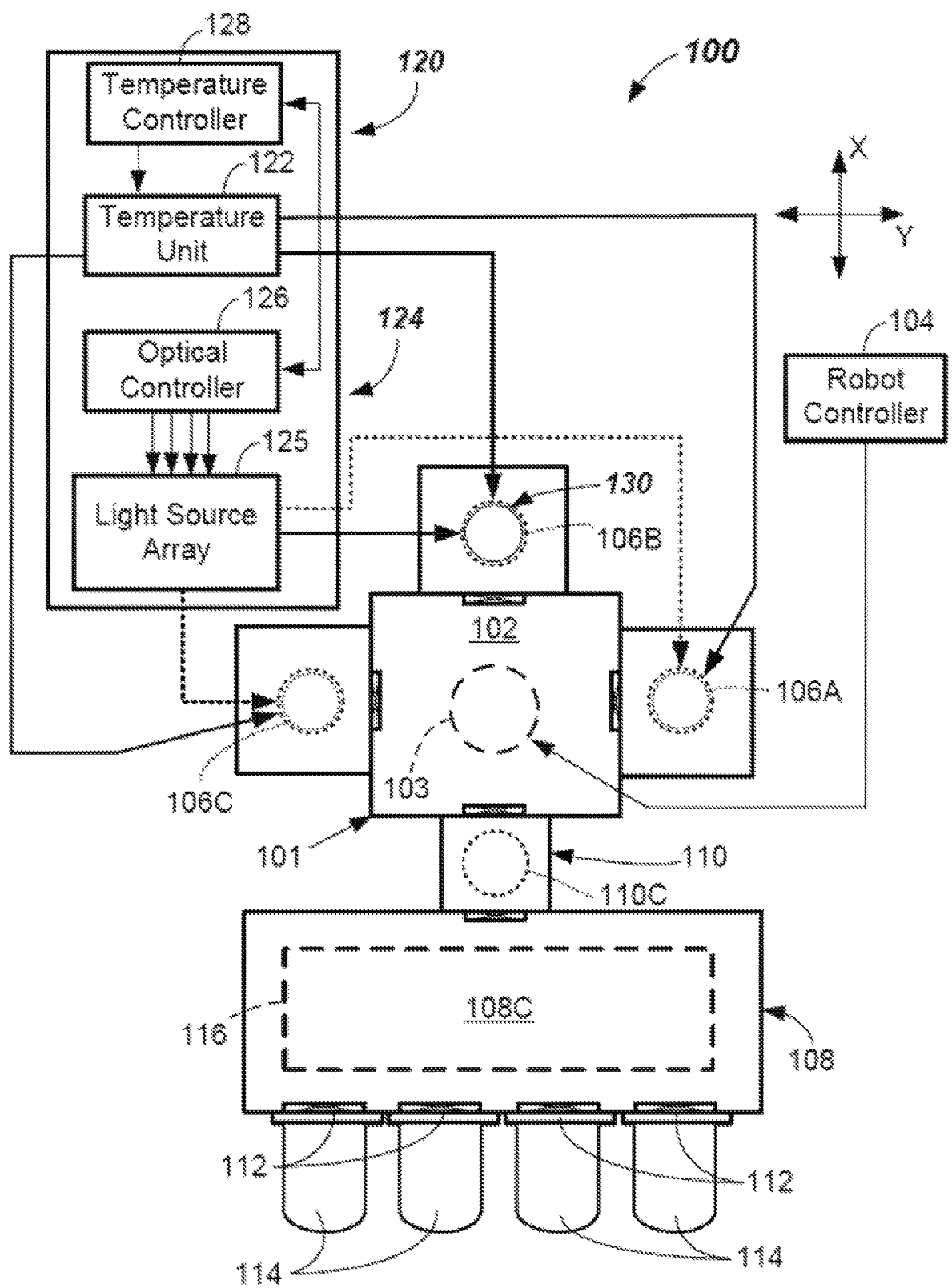
FIG. 1 illustrates a schematic top view of an electronic device processing system including optical fiber heating in one or more process chambers according to embodiments.

Embodiments of the present invention provide a substrate support assembly and an electrostatic chuck that include channels for retaining removable optical fibers. The optical fibers may be used to deliver heat energy by way of photons that impinge on a ceramic material and/or on metal containing inserts in the electrostatic chuck.

Within electronic device manufacturing systems adapted to process substrates at high temperature, very precise temperature control may be beneficial. In some electronic device manufacturing systems, such as PECVD systems, the systems are configured and adapted to operate at operating temperatures above 500° C., at above 600° C., and even as high as 650° C. may be beneficial. Additionally, high temperatures may also be desirable in other semiconductor device manufacturing systems, such as etch systems, furnaces, and so on. Various methods have been employed that utilize zoned resistive heating to accomplish temperature control.

According to one or more embodiments of the invention, electronic device processing systems include a substrate support assemblies adapted to provide improved substrate temperature control during high temperature processing are provided. The apparatus, systems, and methods described herein may provide improved temperature control by providing a temperature-controlled platform such as an electrostatic chuck adapted to thermally control a temperature of a substrate at high temperature, such as above 200° C., above 500° C., and even at about 650° C. The temperature-controlled platform may also be used at lower temperatures, such as at temperatures between 120 to 200° C.

In some embodiments, the substrate support assembly may include a substrate support such as an electrostatic chuck. The electrostatic chuck may include a ceramic plate that acts as a temperature-controlled platform. The substrate support assembly additionally includes a ceramic shaft that has been bonded (e.g., diffusion bonded) to a bottom surface of the ceramic plate. Additionally, the substrate support assembly may include a fiber guide inserted into a cavity in the ceramic shaft. Multiple optical fibers may be routed through channels formed in the fiber guide and into additional channels formed in the ceramic plate. The optical fibers enter individually or in one or more bundles through first channels in the fiber guide and extend (e.g., horizontally or at an angle) within second channels in the ceramic plate and terminate at multiple target locations within the ceramic plate. The multiple optical fibers may be used to provide individually-controllable pixelated heat sources, or optionally, the pixelated sources may be zonally controlled. The optical fiber heating may be used alone as a primary heat source, or as a supplement to other forms of temperature control, such as resistive heating. Including optical fiber heating may provide improved range and flexibility of temperature tuning.

The optical fibers may be inserted into the substrate support during forming or during assembly after the substrate support assembly has been formed. Any of the optical fibers may then later be removed from the substrate support individually or in bundles. New optical fibers may then be inserted into channels into which the removed optical fibers had been located. As optical fibers fail those failed optical fibers may be replaced. Accordingly, the substrate support assembly may be refurbished by replacing one or more failed optical fibers.

Further details of example substrate support assemblies and electrostatic chucks including channel-routed optical fiber heating, electronic device processing systems, and methods are described with reference to FIGS. 1-9 herein.

Embodiments are described herein with reference to a substrate support assembly that includes a ceramic plate and a ceramic shaft bonded to the ceramic plate. However, in alternative embodiments a metal plate may be used instead of a ceramic plate. Additionally, in some embodiments a metal shaft may be used instead of a ceramic shaft. The metal plate and/or metal shaft may be, for example, aluminum or stainless steel. Accordingly, embodiments may include a ceramic plate bonded to a ceramic shaft, a ceramic plate bonded to a metal shaft, a metal plate bonded to a metal shaft, or a ceramic plate bonded to a metal shaft. If a metal plate and/or metal shaft are used, then the plate may be bonded to the shaft, for example, by brazing. It should be understood that all embodiments describing a ceramic plate herein may be modified to instead include a metal plate. It should additionally be understood that all embodiments describing a ceramic shaft herein may be modified to instead include a metal shaft.

FIG. 1 illustrates a schematic top view diagram of an example embodiment of an electronic device processing system 100 including optical fiber heating according to one or more embodiments of the present invention. The electronic device processing system 100 may include a housing 101 having walls defining a transfer chamber 102. Walls may include side walls, floor, and ceiling, for example. A robot 103 (shown as a dotted circle) may be at least partially housed within the transfer chamber 102. The robot 103 may be configured and adapted to place or extract substrates to and from various destinations via operation of moveable arms of the robot 103. "Substrates" as used herein shall mean articles used to make electronic devices or electrical circuit components, such as silicon-containing wafers or articles, patterned or masked silicon wafers or articles, or the like. However, the apparatus, systems, and methods described herein may have broad utility wherever high-temperature control of a substrate is beneficial. Embodiments of the invention may be useful for controlled high-temperature heating, such as above 200° C., above 500° C., about 650° C., or even higher temperatures.

Robot 103, in the depicted embodiment, may be any suitable type of robot adapted to service the various chambers that are coupled to, and accessible from, the transfer chamber 102. Robot 103 may be a selective compliance assembly robot arm (SCARA) robot or other suitable robot type.

The motion of the various arms of the robot 103 may be controlled by suitable commands to a drive assembly (not shown) containing a plurality of drive motors from a robot controller 104. Signals from the robot controller 104 may cause motion of the various components of the robot 103 to cause movement of substrates between the process chambers 106A-106C and one or more load lock chambers 110C. Suitable feedback mechanisms may be provided for one or more of the components by various sensors, such as position encoders, or the like. The robot 103 may include a base that is adapted to be attached to a wall (e.g., a floor or ceiling) of the housing 101. Arms of the robot 103 may be adapted to be moveable in an X-Y plane (as shown) relative to the housing 101. Any suitable number of arm components and end effectors (sometimes referred to as "blades") adapted to carry the substrates may be used.

Additionally, the drive assembly of the robot 103 may include Z-axis motion capability in some embodiments. In particular, vertical motion of the arms along the vertical direction (into and out of the paper in FIG. 1) may be provided so as to place and pick substrates to and from the process chambers 106A-106C and the one or more load lock chambers 110C.

In the depicted embodiment, transfer chamber 102 may have one or more process chambers 106A-106C coupled to and accessible therefrom, at least some of which are adapted to carry out high-temperature processing on the substrates inserted therein. The process chambers 106A-106C may be coupled to facets of the housing 101, and each process chamber 106A-106C may be configured and operable to carry out a suitable process (e.g. a PECVD process or etch process) on the substrates. It should be understood that the substrate support assembly 130 including channel-routed optical fiber heating described herein may have utility for other processes taking place at high temperature, such as physical vapor deposition and ion implant, or the like. In particular, one or more of the processes taking place in the process chambers 106A-106C may include temperature control via channel-routed optical fiber heating in accordance with an aspect of the invention.

Within the electronic device processing system 100, substrates may be received from a factory interface 108, and also exit the transfer chamber 102 into the factory interface 108 through load lock chamber 110C of a load lock apparatus 110. The factory interface 108 may be any enclosure having wall surfaces forming the factory interface chamber 108C. One or more load ports 112 may be provided on some surfaces of the factory interface 108 and may be configured and adapted to receive (e.g., dock) one or more substrate carriers 114 (e.g., front opening unified pods—FOUPs) such as at a front surface thereof.

Factory interface 108 may include a suitable load/unload robot 116 (shown dotted) of conventional construction within a factory interface chamber 108C. The load/unload robot 116 may be configured and operational to extract substrates from the interior of the one or more substrate carriers 114 and feed the substrates into the one or more load lock chambers 110C of load lock apparatus 110.

In accordance with one or more embodiments of the invention, a substrate support assembly 130 that includes a substrate support (e.g., an electrostatic chuck) may be provided in one or more of the process chambers 106A-106C. As will be apparent from the following, channel-routed optical fiber heating adapted to provide light-based heating of a substrate may be provided by the substrate support assembly 130. The description herein will focus on providing the substrate support assembly 130 in process chamber 106B. However, an identical substrate support assembly 130 may be included in one or both of the other process chambers 106A, 106B. In some embodiments, the substrate support assembly 130 may be included in all process chambers 106A-106C. More or less numbers of process chambers including the substrate support assembly 130 may be provided.

Figure 2:
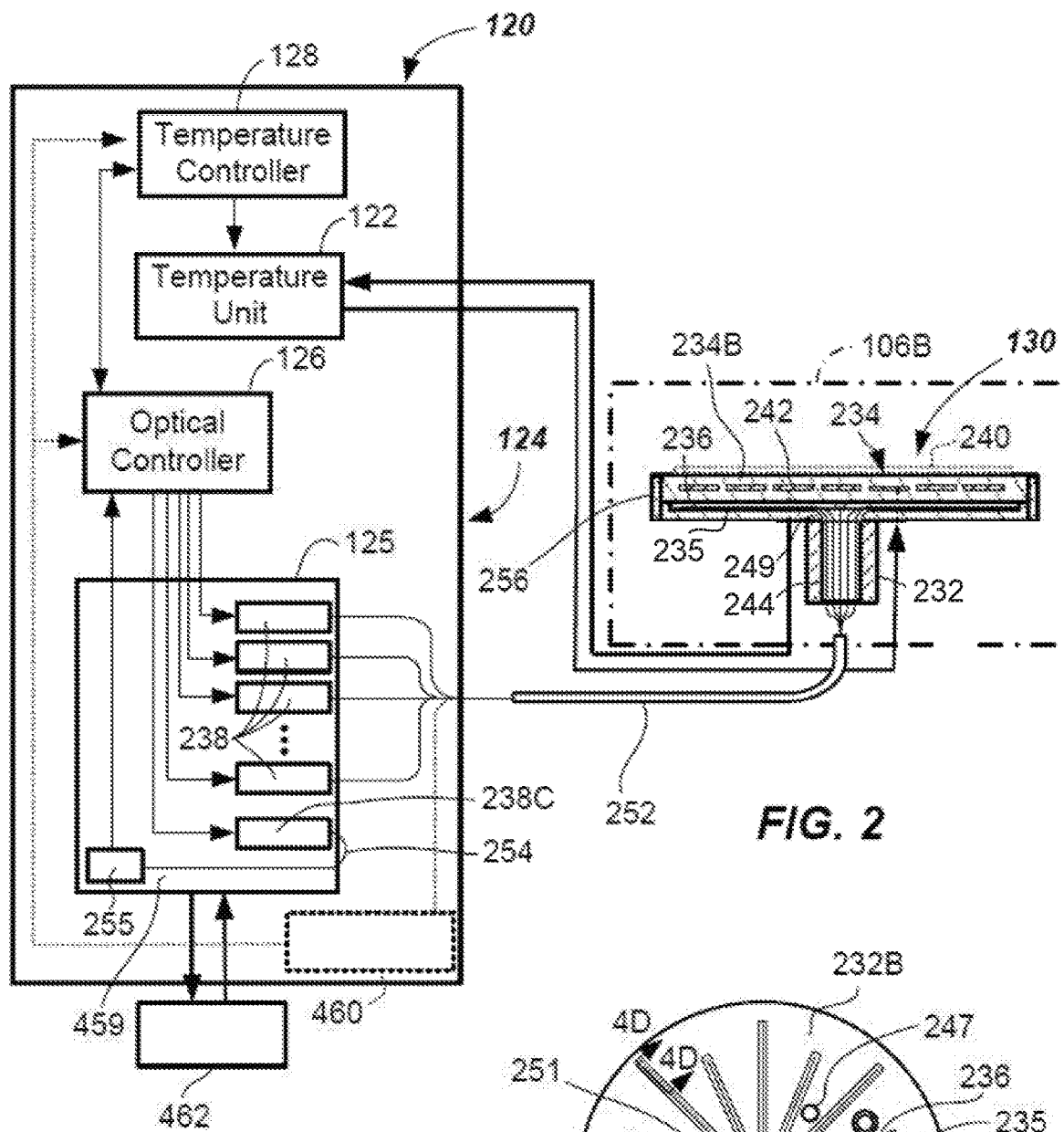
FIG. 2 illustrates a schematic partially cross-sectioned view of a substrate temperature control system including optical fiber heating, wherein the optical fibers are laid in channels according to embodiments.

Referring now to FIGS. 1 and 2, in some embodiments, a temperature unit 122 that may be coupled to one or more thermal elements 242 (e.g., resistive heating elements) may be used in conjunction with channel-routed optical fiber heating provided by the substrate support assembly 130 to control a temperature of one or more portions of a substrate 240 to a target temperature. The thermal elements (resistive heating elements) 242 may provide a first level of temperature control of a substrate support (e.g., of a ceramic plate or electrostatic chuck) and the optical fibers may provide a second level of temperature control of the substrate support (e.g., of the ceramic plate or electrostatic chuck).

At a system level, the temperature control may be provided, in the depicted embodiment, by a substrate temperature control system 120. Substrate temperature control system 120 may be a subpart of the electronic device processing system 100. Substrate temperature control system 120 may include the temperature unit 122 that may couple and provide power to the thermal elements 242 (e.g., metal resistive heating elements or traces) and which may constitute a primary source of temperature control (e.g., heating) to one or more of the chambers (e.g., process chambers 106A, 106B, 106C).

An optical heating system 124 may operate as a supplemental heating system in conjunction with the temperature unit 122 and thermal elements 242 in some embodiments. In other embodiments, the optical heating system 124 may be the sole heating system adapted to heat the substrates 240 within the one or more process chambers 106A-106C.

Optical heating system 124 may include a light source array 125 coupled (e.g., optically coupled) to the substrate support assembly 130, and an optical controller 126. Substrate temperature control system 120 may include a temperature controller 128 operational to control temperature of the substrate 240 that is being temperature controlled within the chamber (e.g., process chamber 106B). Temperature controller 128 may be operational to control the temperature unit 122 and may interface with the optical controller 126 in some embodiments. Thus, the temperature controller 128 may be used to communicate with the optical controller 126 and the temperature unit 122 to control a temperature of the substrate 240 in thermal contact with the substrate support assembly 130. Suitable temperature feedback may be provided from one or more locations. In some embodiments, the temperature controller 128 and/or the optical controller 126 may receive temperature feedback from optical sensors inserted into the substrate support assembly 130, as will be explained further herein.

Figure 3:
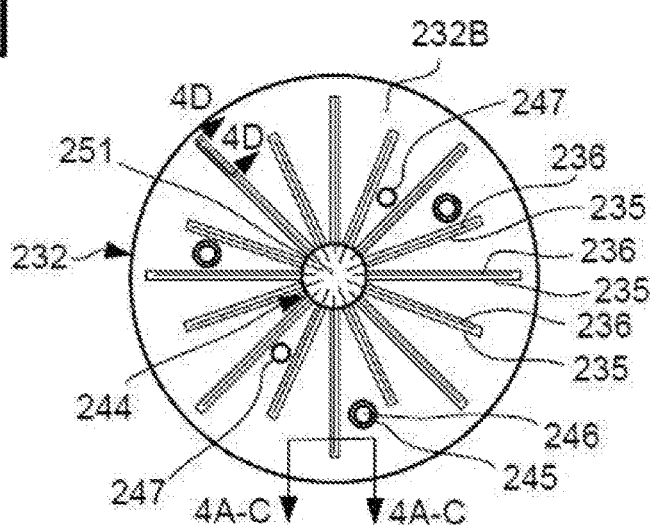
FIG. 3 illustrates a schematic top view of a portion of a substrate support assembly with the upper member removed to show positioning of the optical fibers within channels (e.g., spokes) according to embodiments.

Now referring to FIGS. 2 and 3, the substrate support assembly 130, which is included in optical heating system 124, is described in more detail. Optical heating system 124 may include a substrate support assembly 130, which may include a platform (e.g., an electrostatic chuck that includes a ceramic plate and an embedded chucking electrode) on which a substrate 240 (shown dotted) may rest or be in thermal contact with. Substrate support assembly 130, as shown, includes an electrostatic chuck that includes a ceramic plate 234 with embedded electrodes, resistive heating elements, channels, and so on. The substrate support assembly 130 additionally includes a ceramic shaft 232 bonded to the ceramic plate 234. In some embodiments, the substrate support assembly further includes a fiber guide 244 inserted into a cavity in the ceramic shaft 232. A plurality of channels 235 are formed in the ceramic plate 234. An additional plurality of channels is formed in the fiber guide 244 and/or in the ceramic shaft 232. A plurality of optical fibers 236, adapted to provide light-based heating, are routed through the channels in the ceramic shaft 232 and/or fiber guide 244 and extend within channels 235 in the ceramic plate 234 of an electrostatic chuck.

As shown, the plurality of optical fibers 236 are configured to extend laterally within the channels 235. Extend laterally, as used herein, means that the length of the optical fiber (along its longitudinal axis) passes horizontally within the channels 235. Channels 235 may be oriented to extend substantially parallel to an upper surface plane of the ceramic plate 234. Some slight deviation from parallel is possible due to laying the optical fibers 236 in the channels 235. The plurality of channels 235 may be provided in any suitable pattern. One pattern includes a plurality of radial spokes, as shown in FIG. 3. Other suitable channel patterns may be used.

The plurality of optical fibers 236 are adapted to provide light-based heating of the substrate 240. The plurality of optical fibers 236 may terminate at multiple radial locations in the channels 235 (see FIG. 3, for example). Optical fibers 236 may pass through the ceramic shaft 232 and/or fiber guide 244 individually or as a bundle (e.g., as a group of fibers) and then bend and extend laterally within the channels 235. Optical heating system 124 may include the light source array 125 including a plurality of light sources 238 coupled to at least some, and preferably most or all, of the plurality of optical fibers 236. The optical controller 126 may be configured to control light power (e.g., intensity) channeled into, and carried by, the plurality of optical fibers 236.

In operation, light carried in at least some of the plurality of optical fibers 236 is used to heat local portions of the ceramic plate 234, and thus by at least conduction, the substrate 240. In some embodiments, metal containing objects (not shown) are embedded in the ceramic plate proximate to ends of the channels. The metal containing objects may absorb photons emitted by the optical fibers and heat as a result of the absorption. When the plurality of optical fibers 236 are positioned and terminated at target locations, many local portions of the ceramic plate 234 may be heated. In some embodiments, this localized heating may be in conjunction with temperature control provided by the temperature unit 122 and the thermal elements 242. In other embodiments, the localized (e.g. pixelated) heating by the plurality of optical fibers 236 may be the sole heating provided to the ceramic plate 234.

For example, temperature control may, in some embodiments, cause the substrate 240 (shown dotted) to be heated to a nominal temperature of greater than about 200° C., greater than about 500° C., greater than about 600° C., or even about 650° C., or a greater temperature. For example, temperature control may, in some embodiments, cause the substrate 240 (shown dotted) to be heated to a nominal temperature of between about 600° C. and about 700° C. Such heating may be carried out on substrates 240 within the one or more process chambers 106A-106C in some embodiments. For example, temperature control may, in some embodiments, cause the substrate 240 (shown dotted) to be heated, such as in a PECVD process.

In some embodiments, the thermal elements 242 may provide a primary heating source to heat the ceramic plate 234 to a nominal temperature, and the optical fibers 236 may act as assistive or supplemental heating sources, such that the nominal temperature may be further adjusted between bounds, such as between about +/−5° C. from a nominal temperature, between about +/−10° C. from the nominal, or even between about +/−25° C. from the nominal, for example. Other temperature adjustment magnitudes may be accomplished by using light sources 238 that are more or less powerful (having more or less light output power). Thus, in accordance with aspects of the invention, temperature control may be implemented by the optical fiber heating on a pixelated basis.

Some of the optical fibers 236 may include various optical features at the fiber termination, including a diffuse emitter, a lensed tip, or an angled cleave. Such optical features may be used to direct light to one or more surfaces of the diffuser or otherwise minimize light reflection back into the optical fiber 236.

Operation of the optical fiber heating will now be described. For example, if the nominal target temperature of the substrate 240 is about 650° C., but geometrical or thermal anomalies or other differences in the process chamber 106B or the design of the ceramic plate 234 make it difficult to achieve that nominal temperature across all parts of the substrate 240, then auxiliary heating may be provided by the optical heating system 124 in addition to any heat provided by the temperature unit 122 and coupled thermal elements 242. Auxiliary heating may be provided, in one or more embodiments, by the optical heating system 124 to adjust localized regions in order to meet any target temperature profile. In some embodiments, optical heating system 124 may be used to adjust localized regions to provide a substantially uniform temperature profile of the substrate 240. However, the target temperature profile may be made intentionally non-uniform in some embodiments.

It should also be apparent that in some embodiments, the optical heating system 124 may be the sole source of heating (i.e., no temperature unit 122 or thermal elements 242 are present). In this embodiment, the optical controller 126 may be the sole temperature controller present and may adjust temperature of localized regions by adjusting the light intensity to individual optical fibers 236, either individually or zonally.

The ceramic plate 234 and the ceramic shaft 232 may be formed of the same ceramic material. In one embodiment, the ceramic plate 234 and ceramic shaft 232 are aluminum nitride (AlN). In another embodiment, the ceramic plate 234 and ceramic shaft 232 are aluminum oxide ($Al_2O_3$). The ceramic plate 234 and the ceramic shaft 232 may have been diffusion bonded to form a single monolithic ceramic body that includes the ceramic shaft 232 and the ceramic plate 234. An exterior of the ceramic shaft 232 may be exposed to a processing chamber in embodiments. In some implementations, the processing chamber may be exposed to a plasma environment (e.g., a fluorine plasma environment) and/or may be pumped down to reduced pressure (e.g., to vacuum). An interior of the ceramic shaft 232 may be protected from the plasma environment.

One or more holes may be drilled into a wall of the ceramic shaft to provide access for electrical lines to connect to the thermal elements 242 (also referred to as heating elements) and/or to one or more electrodes. The electrodes may include a chucking electrode that is used to secure a substrate to the substrate support assembly and/or a radio frequency (RF) electrode. The chucking electrode may use electrostatic forces to pull the substrate towards the ceramic plate. Holes may also be drilled into the wall of the ceramic shaft to enable helium to be pumped into region between a backside of substrate 240 and the upper surface of the ceramic plate 234.

In the depicted embodiment, a single cavity that is centrally located is provided through the ceramic shaft 232 as shown. The fiber guide 244 is then inserted into the cavity in the ceramic shaft 232. In one embodiment, the cavity is a circular cavity and the fiber guide is cylindrical (has a cylindrical shape). In one embodiment, the fiber guide 244 is a metal cylinder that includes the multiple channels. Examples of metals that may be used for the fiber guide 244 include stainless steel and aluminum. The channels may be holes drilled in walls of the fiber guide 244 or may be grooves machined into the outer perimeter of the fiber guide. The fiber guide 244 may be removable from the ceramic shaft 232. Secondary passages 245 may also be included through the ceramic body 234 to accommodate lift pins 246, temperature probes, or the like.

In alternative embodiments, no separate fiber guide 244 is used. Instead, the ceramic shaft 232 may have multiple channels formed therein for routing optical fibers into the channels 235 and may act as a fiber guide.

In some embodiments, a single optical fiber 236 may be received in each channel 235. In other embodiments, multiple optical fibers 236 may be received in some channels 235 (see FIGS. 6A-6B).

Once passing through the fiber guide 244, the optical fibers 236 are bent around the radius 249 (e.g., at an approximate 90 degree angle) and extend outwardly (e.g., radially in some embodiments) and are laid in the channels 235. The fiber guide 244 may be shaped to cause the fibers to automatically bend and be guided into the channels 235 as the optical fibers are pushed into the fiber guide 244.

In addition to optical fibers 236 that are used to provide heating, some optical fibers 236 may be used as fiber optic temperature sensors. For example, some optical fibers 236 may be fiber optical thermocouples. The fiber optical thermocouples and/or other fiber optical temperature sensors may be used to measure the temperature of the ceramic plate at various regions. Each optical fiber that is a component of a fiber optic temperature sensor may be used to measure a temperature at a region of the ceramic plate. In some embodiments, optical fibers may be used both for heating and for temperature measurement. For example, an optical fiber may be split into two portions at one end. A first portion may be routed to an optical heat source such as a laser diode and a second portion may be routed to a temperature sensor.

Optical fibers 236 may be of various suitable lengths and may extend laterally to various target termination locations within the channels 235. Channels 235 may be of different lengths as shown in FIG. 3, and may have any suitable channel shape. In some embodiments, the channels 235 may be straight, whereas others may be curved, circular, or even serpentine (see FIGS. 5 and 6A). Combinations of straight, curved, circular, and serpentine channels 235, or straight, curved, circular, and serpentine portions may be used to construct each channel 235.

Figure 4A:
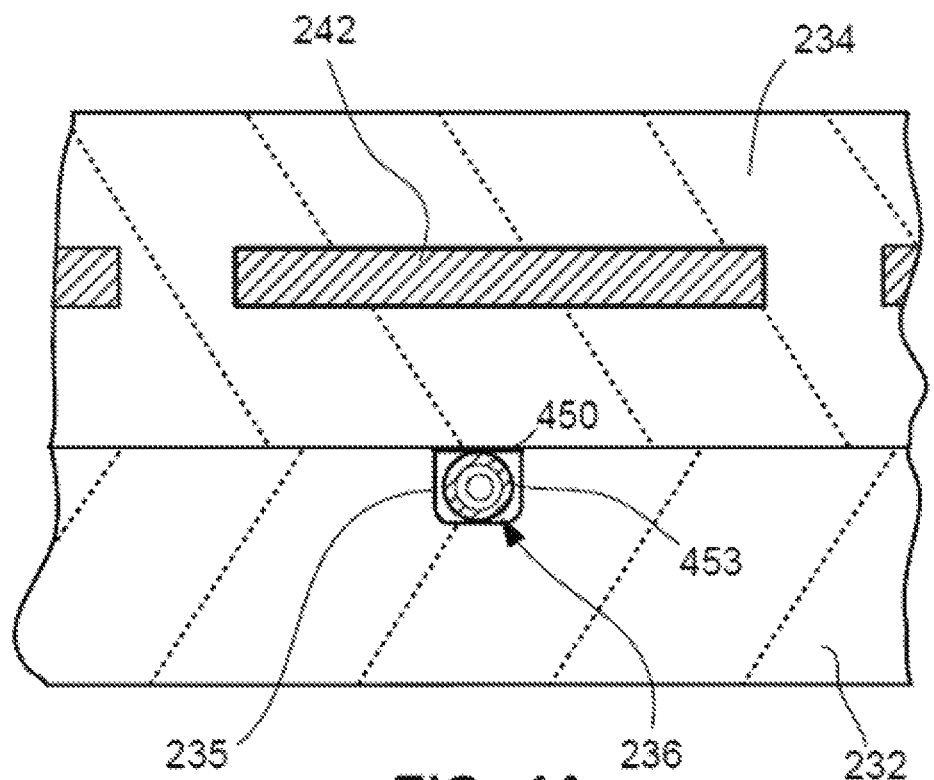
FIG. 4A illustrates an enlarged partial cross-sectioned view of a portion of a substrate support assembly showing a first embodiment of positioning of an optical fiber within a channel.
Figure 4B:
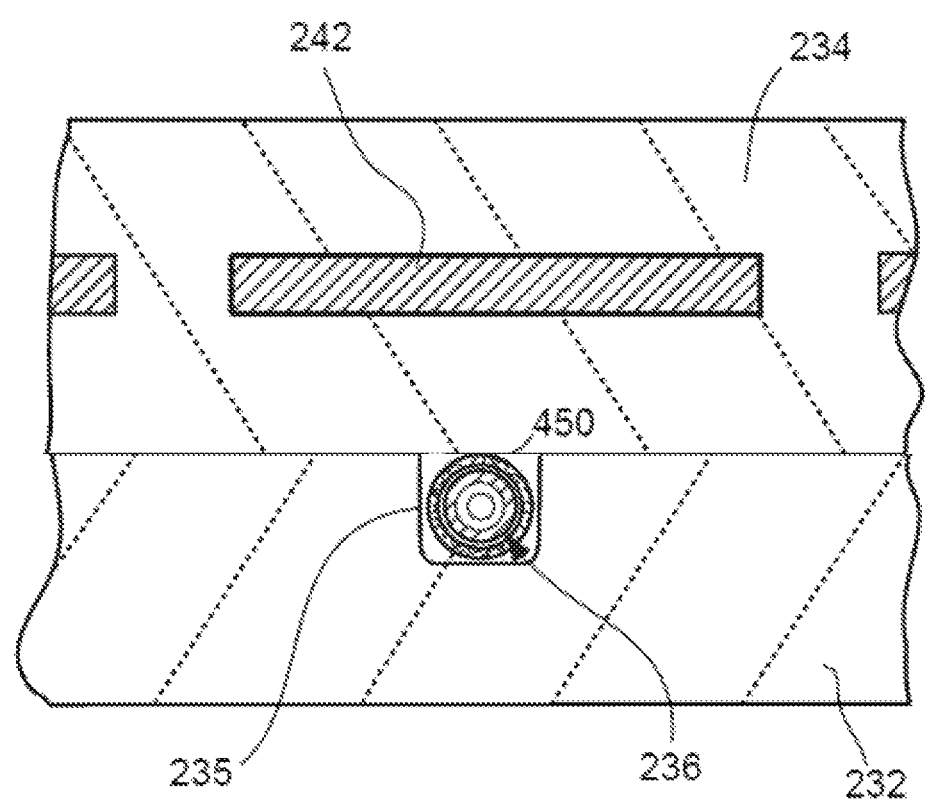
FIG. 4B illustrates an enlarged partial cross-sectioned view of a portion of a substrate support assembly showing a second embodiment of positioning of an optical fiber with a sheath barrier within a channel.
Figure 4C:
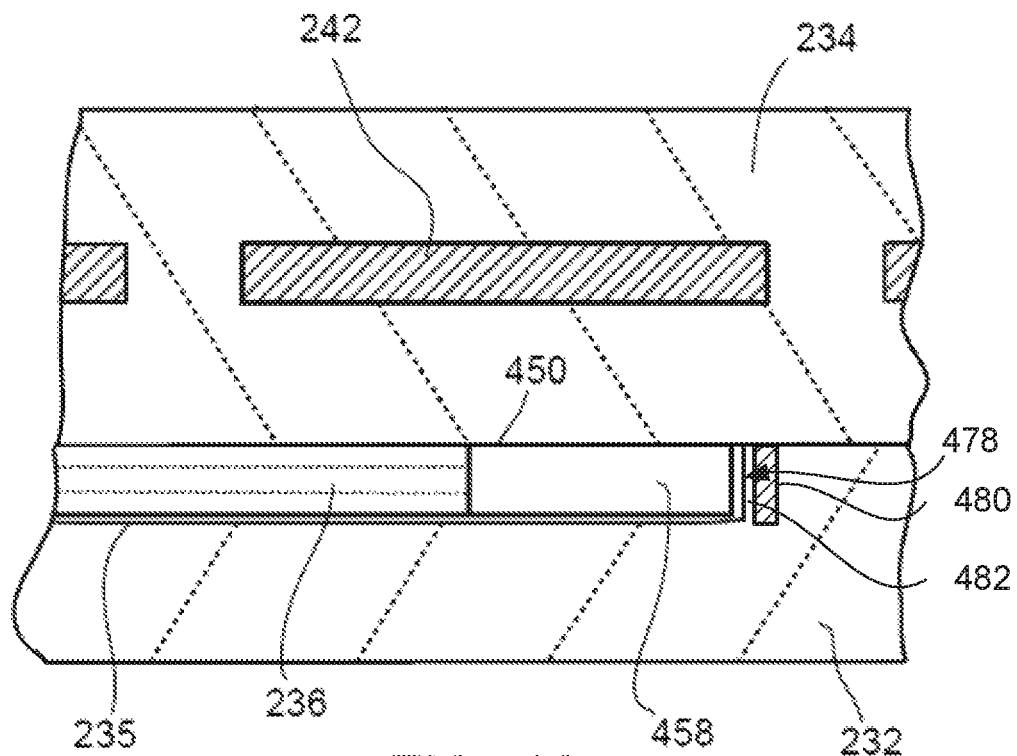
FIG. 4C illustrates an enlarged partial cross-sectioned view of a portion of a substrate support assembly showing one embodiment of an optical fiber within a channel.

Channels 235 may also have any suitable cross-sectional shape. For example, FIGS. 4A-4C illustrates various shapes of channels 235. FIG. 4A illustrates an enlarged partial cross-sectional view taken along section line 4A-4A' in FIG. 3. The shape of the channel 235, as shown, may be generally rectangular in cross-section. However, other cross sectional shapes may be used, such as half round, trapezoidal, or the like. The ceramic plate 234 may initially be multiple different ceramic green bodies. The channels 235 may be formed in one of the ceramic green bodies after which the ceramic green bodies may be compressed and heated to fire or sinter the ceramic green bodies together to diffusion bond the ceramic green bodies and transform them into a monolithic sintered ceramic plate. The channels 235 may be formed by any suitable machining means, such as laser machining, abrasive water jet cutting, grinding or milling (e.g., with diamond tools), and the like. The channels 235 may be larger in width than a width of the optical fiber 236 so that the optical fiber 236 may not undergo stress due to thermal expansion mismatch. For example, the width of the channel 235 may be about 1 mm greater than or more than an outer dimension of the optical fiber 236 or group of optical fibers 236 that are routed within the channel 235. For example, the dimensions of the channels 235 may be between about 1 mm and 3 mm wide, and between about 1 mm and 3 mm deep. Other dimensions may be used.

The number of channels 235 may number 20 or more, and between about 50 and 500 in some embodiments, such as when a single optical fiber 236 is received in each channel. In some embodiments, where multiple optical fibers 236 are received in each channel 235, between about 5 and about 50 channels 235 may be provided. Thus, depending on the design, between about 5 and about 500 channels may be provided. A coating may be applied to the interior of one or more of the channels 235 to improve light absorption. For example, a black-colored high temperature coating suitable for high temperature service may be used.

In FIG. 4B, a sheath or sleeve 450 may be provided in the channel 235 and may loosely surround the optical fiber 236 along its length. In one or more embodiments, the sheath or sleeve 450 may be a woven, braided, or fibrous ceramic cloth or paper. Other materials such as fiberglass, capillary tubing or plastic tubing may be used. Other suitable high-temperature materials may be used for the sheath or sleeve 450.

In some embodiments, a radial edge and/or upper surface of substrate support assembly 130 may include a protective layer 256 of an etch-resistant material. The protective layer 256 may be made of any material that resists etching by the gases or other material present within the process chamber 106B. For example, the protective layer 256 may be a Yttrium oxide (Yttria) material, which may be applied by a spraying process (e.g., plasma spraying). Other suitable application processes may be used.

The ceramic plate 234 may include the thermal elements 242 imbedded therein. The thermal elements 242 may provide single-zone heating or dual-zone heating in some embodiments, and may be configured vertically above the location of the optical fibers 236. The thermal elements 242 may provide a majority of the heat and the light-based heating provided by the optical fibers 236 provide localized heating supplements to provide the capability of making local temperature adjustments adjacent to the terminations locations of the optical fibers 236.

In the depicted embodiment of FIGS. 1-2, the optical controller 126 may be any suitable controller having a processor, memory, and peripheral components adapted to execute a closed loop or other suitable control scheme and control the optical power (e.g., Watts) emanating from each of the light sources 238 of the light source array 125. At least some of the light sources 238 are coupled to the optical fibers 236 and provide optical power thereto (e.g., infrared energy). Optical fibers 236 may be arranged in a bundle (as shown) and may include a protective sheath 252 over at least some of the length. Sheath 252 may be a flexible stainless steel tube in some embodiments. Other suitable sheath materials may be used.

Optical fibers 236 may include any suitable optical fiber type, such as graded-index optical fiber, step-index single mode optical fiber, multi-mode optical fiber, or even photonic crystal optical fiber. Optical fibers 236 that exhibit relatively high bend resistance may be used in some embodiments. Relatively high numerical aperture (NA) fibers may be used, such as NA of greater than about 0.1, greater than about 0.2, or even greater than about 0.3. Any suitable number of optical fibers 236 may be used, such as 20 or more, 50 or more, 100 or more, 200 or more 300 or more, 400 or more, and even up to 500 or more. As previously mentioned, some of the optical fibers may be fiber thermocouples. The termination of the optical fibers 236 may be located below the upper surface of the ceramic plate 234 by between about 0.125 inch (about 3.2 mm) to about 0.5 inch (12.3 mm). Other vertical locations are possible.

One example with 277 optical fibers 236 coupled to 10 W light sources 238 where the terminations of the optical fibers 236 in the channels 235 are located at 0.325 inch (8.3 mm) below the upper surface of the ceramic plate 234 provides relatively uniform light-based heating. Optical fibers 236 may be coupled to the respective light sources 238 by any suitable conventional coupling means.

As shown in FIG. 4A, the optical fibers 236 may each include a metal film 453. Depending on the operating temperature, aluminum, copper or gold may be used for the metal film 453. At temperature around 650° C., gold may be used for the metal film 453. The metal film 453 may be about 15 microns thick, for example. Other thicknesses may be used.

The optical fibers 236 may comprise standard polymer-coated optical fibers (e.g., acrylate or acrylate-epoxy polymer coating). The optical fibers 236 may be spliced to the polymer-coated fibers in some embodiments.

In some embodiments, one or more of the light sources 238C may be coupled by a sensor fiber 254 to a control sensor 255, such as a light receiver (e.g., photodiode). Each light source 238 may be a laser diode, such as a single emitter diode. The laser diode may have any suitable output wavelength range, such as between about 915 nm and about 980 nm, for example. Other output ranges may be used. Output power may be modulated between about 0 W to about 10 W. However, ever higher power diodes (e.g., >10 W) may be used. The laser diode may include an optical fiber output having a 105 or 110 micron core diameter, for example. For example, a model PLD-10 from IPG Photonics of Oxford, Mass. may be used. Other types of light sources 238 may be alternatively used. According to embodiments, between about 20 and about 500 light sources 238 may be used. As shown, the light sources 238 may be rest upon or be in thermal engagement with a common heat sink 459, which may be cooled (e.g., liquid cooled) to between about 20° C. and about 30° C. by a cooling source 462. Cooling source 462 may be a source of chilled water, for example. Other types of cooling sources 462 may be used.

A control sensor 255 may be used to provide feedback to the optical controller 126 on a relative output of a control light source 238C (e.g., of light intensity or heat generation, for example). Optionally or in addition, one or more optical temperature sensors may be provided in one or more of the channels 235 and coupled to a temperature measuring system 460 to enable localized temperature monitoring of an inside portion of the substrate support assembly 130. For example, the optical temperature sensor may be a fiber Bragg grating coupled to a spectrometer, which may be the temperature measuring system 460. A fiber multiplexer or other like component may be used to connect multiple optical temperature sensors to a single spectrometer. An optical temperature sensor may also be accomplished by other suitable means, such as by embedding a tip of an optical fiber in a suitable adhesive material (e.g., CERA-MACAST 865 available from Aremco Products Inc. of Valley Cottage, N.Y.) and measuring the thermal radiation emitted by that material. Thermal measurement may be accomplished by coupling the optical fiber to an indium gallium arsenide photodiode. The optical fibers coupled to the optical temperature sensor may also be placed in a channel 235. Any suitable temperature measuring system 460 may be used to interrogate the optical temperature sensor 458. Temperature measuring system 460 may interface with the temperature controller 128 and/or the optical controller 126 to provide temperature feedback. Optionally or additionally, thermal feedback by other methods, such as two or more RTDs on the substrate support assembly 130 may be used.

Each light source 238 may be individually controlled and modulated from a low or zero level of optical power output to a high or maximum level of optical power output. Each light source 238 may be individually controlled in order to control temperature at finite points (pixels) or collectively controlled in groups of optical fibers to control temperatures of one or more regions or zones of the substrate support assembly 130.

Any suitable temperature control philosophy may be implemented. In one control aspect, a highly uniform temperature distribution across an upper surface of the substrate 240 may be sought. In another aspect, a deliberately non-uniform temperature distribution may be beneficial (e.g., hotter or cooler at an edge of the substrate 240). Each temperature profile may be provided, in accordance with aspect of the invention depending on the control philosophy implemented by the optical controller 126. Some embodiments of the invention may provide azimuthal temperature variations.

Figure 4D:
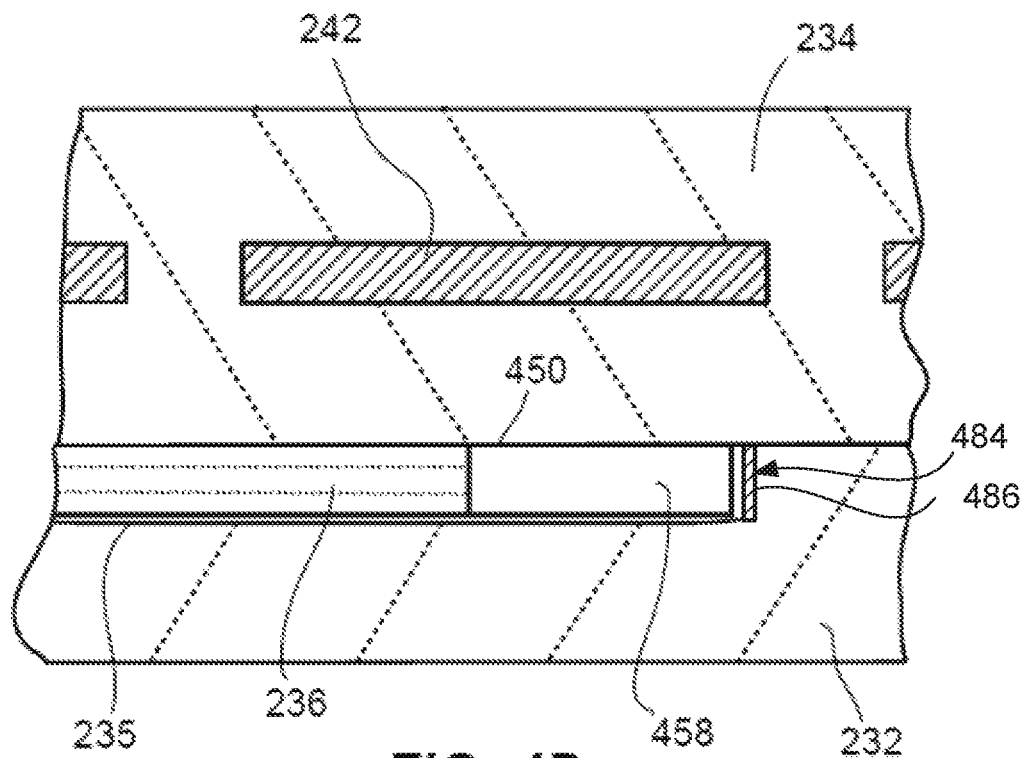
FIG. 4D illustrates an enlarged partial cross-sectioned view of a portion of a substrate support assembly showing another embodiment of an optical fiber within a channel.

FIG. 4C illustrates an enlarged partial cross-sectioned view of a portion of a substrate support assembly showing one embodiment of an optical fiber within a channel. FIG. 4D illustrates an enlarged partial cross-sectioned view of a portion of a substrate support assembly showing another embodiment of an optical fiber within a channel. The cross-sectioned views of FIG. 4C and FIG. 4D are taken at line 4D-4D' in FIG. 3 according to embodiments. As shown, a ceramic plate 234 of the substrate support assembly includes thermal elements 242 and a channel 235 into which an optical fiber 236 has been inserted.

With reference to FIG. 4C, a metal containing object 480 has been inserted into the ceramic plate 234 proximate to an end 478 of the channel 235. The metal containing object 480 may be a metal absorption tablet such as a molybdenum tablet, a tungsten tablet or a metal alloy tablet that includes molybdenum and/or tungsten. The metal containing object 480 may also be a metal wire or a mixture of a metal (e.g., tungsten or molybdenum) and a ceramic (e.g., AlN or $Al_2O_3$). Prior to forming the ceramic plate a ceramic green body into which the channels are formed may also be machined to include cavities for receiving the metal containing objects 480. The metal containing objects 480 may then be placed into the cavities in the green body before the green body is sintered with other green bodies to form the ceramic plate 234.

A thin wall 482 of the ceramic plate separates the metal containing object 480 from the channel 235. This may protect the metal containing object 480 from exposure to air and may prevent the metal containing object 480 from oxidizing. Photons may be emitted from an end of the optical fiber 236 and projected toward the metal containing object 480. The metal containing object may absorb the photons and heat up. The metal containing object may then radiate heat and heat up a region of the ceramic plate 234.

With reference to FIG. 4D, a metal containing object 486 has been inserted into the ceramic plate 234 in the channel 235 at an end 484 of the channel 235. The metal containing object 486 may correspond to any of the aforementioned metal containing objects. In one embodiment, the metal containing object 486 is the mixture of metal and ceramic and is screen printed onto the end 478 of the channel 235. Alternatively, the metal containing object 486 may be screen printed onto a surface of a green body such that when the green body is bonded to another green body that includes the channel 235, the metal containing object 486 occupies a space at the end of the channel 235. The green bodies may then be co-sintered to form the ceramic plate 234 having the metal containing object 486 at the end of the channel 235.

Figure 5:
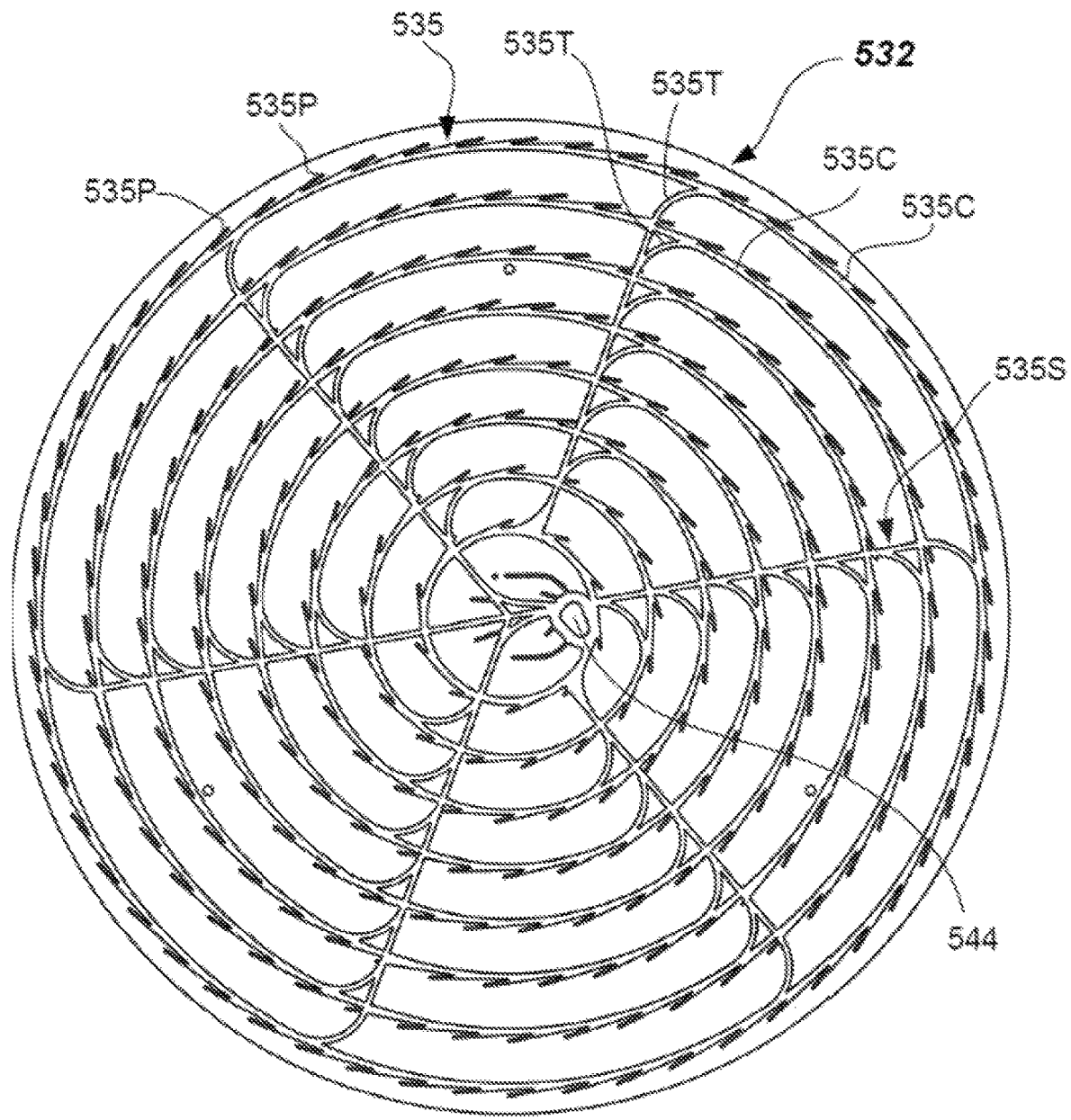
FIG. 5 illustrates a schematic top plan view of a portion of a substrate support assembly according to embodiments with the upper member removed to show patterns of various channels.

Referring now to FIG. 5, a sectional view of another embodiment of a ceramic plate 532 including a plurality of channels 535 formed in a pattern and interconnecting to a passage 544 is shown. Optical fibers (not shown) of pre-measured length may be fed as a bundle through the passage 544 and routed within and positioned into place (e.g., laid and at least temporarily adhered) in the plurality of channels 535. The plurality of channels 535 may be provided in a pattern including at least some radial spokes 535S. Radial spokes 535S may emanate from at or near the passage 544 and extend radially outward therefrom. In some embodiments, the radial spokes 535S may not be straight, but may include a curvature thereon. In some embodiments, the radial spokes 535S may depart from a purely radial orientation, and may be angled by as much as 60 degrees therefrom. Six radial spokes 535S are shown, but more or less numbers of radial spokes 535S may be used.

In another aspect, the plurality of channels 535 may be provided in a pattern including one or more of circular channel sections 535C that may be either partial or full circles. A plurality of full circles as circular channel sections 535C are shown in FIG. 5. The circular channel sections 535C may be concentric, as shown, in some embodiments. Eight circular channel sections 535C are shown, but more or less numbers of circular channel sections 535C may be used.

As shown in FIG. 5, when the plurality of channels 535 include a pattern having both a plurality of radial spokes 535S and circular channel sections 535C, then transition channels 535T may be provided. Transition channels 535T may have a radius of greater than about 15 mm to allow for a smooth transition from the radial spokes 535S to the circular channel sections 535C. Each of the channels 535 may terminate in a channel pocket 535P (a few labeled) and the optical fibers (not shown) may be cleaved to a length where the termination ends within the channel pocket 535P. This aids in precisely locating the terminations.

Figure 6A:
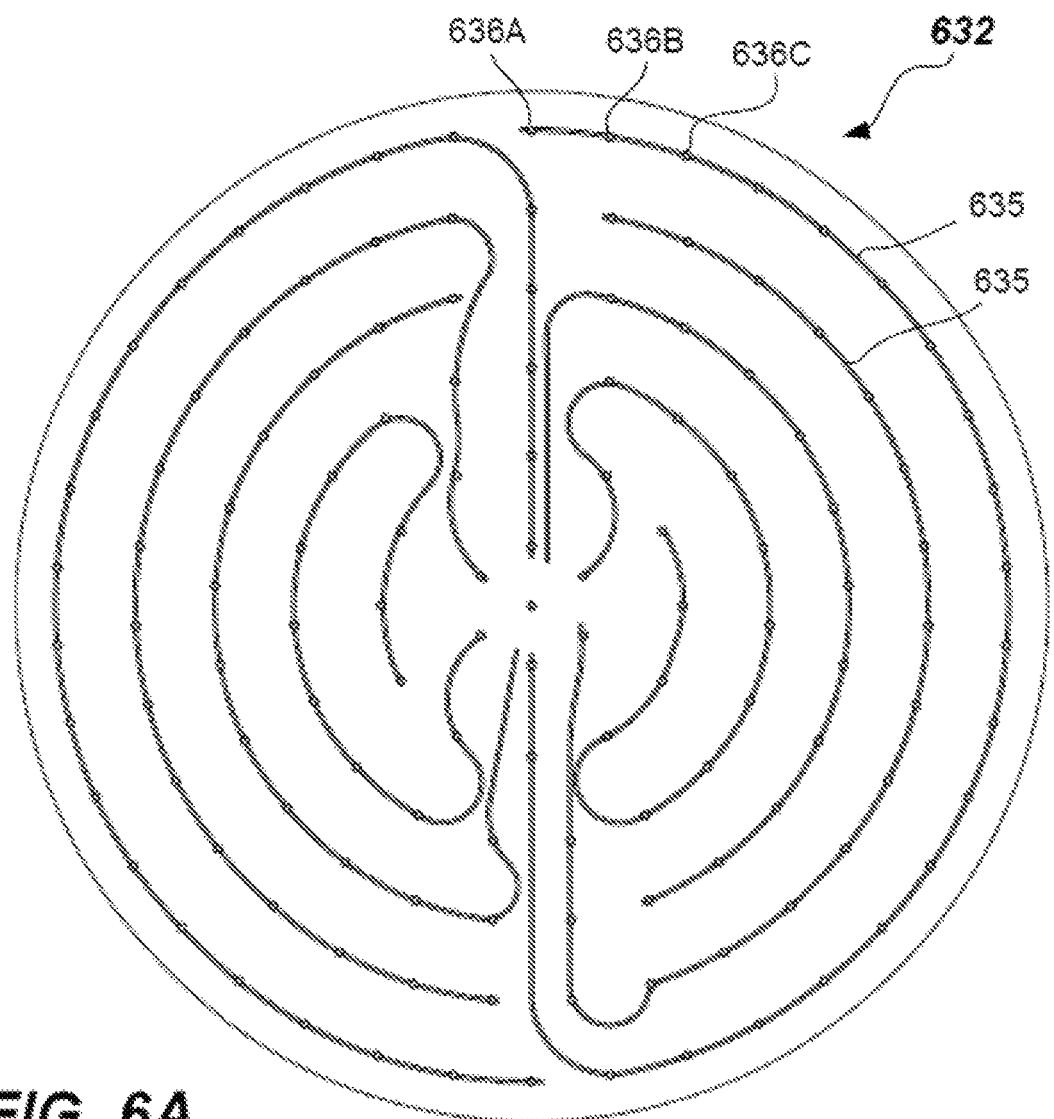
FIG. 6A illustrates a schematic top plan view of a portion of a substrate support assembly according to embodiments with the upper member removed to show serpentine configuration of the various channels.

FIG. 6A illustrates a sectional view of another embodiment of the a ceramic plate 632 including channels 635 formed therein. Channels 635 comprise serpentine paths as shown, but the channel paths can be of any shape. The channels 635 are shown machined in the ceramic plate 632. These channels 635 start at near center and intersect target "pixel" locations as they move outward. Eight channels 635 are shown, but the number of channels 635 may be more or less, depending on the number of target "pixel" locations.

Optical fibers 636A, 636B, 636C, etc. may be inserted into the channels 635 after the ceramic plate 632 having the channels 635 has been formed. Because the optical fibers 636A, 636B, 636C, etc. are not installed at the time of forming the ceramic plate 632, high temperature bonding processes may be used (e.g., diffusion bonding process). Diffusion bonding takes place around 1500-1800° C., which is above the melting temperature of the optical fibers (about 1600° C.), and may provide a higher bond strength.

Figure 6B:
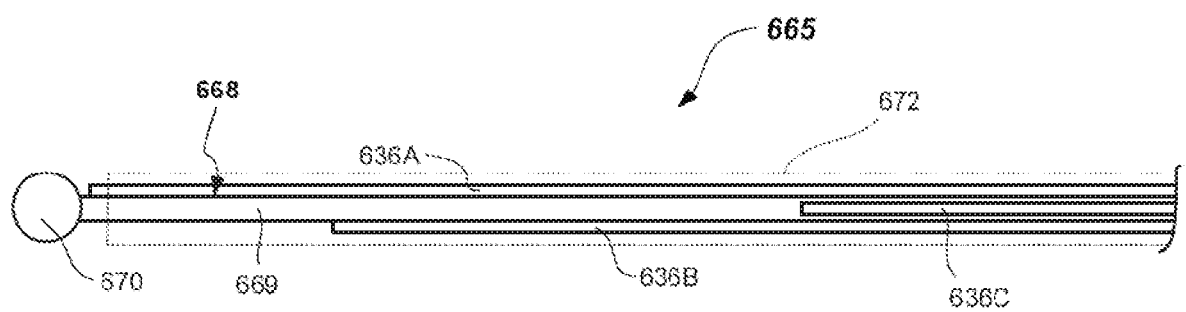
FIG. 6B illustrates a partial side view of a portion of a fiber assembly adapted to be inserted into a channel according to embodiments.

To accomplish insertion into the channels 635 after bonding, multiple optical fibers (e.g., optical fibers 636A, 636B, 636C shown) may be bundled into a fiber assembly 665 as shown in FIG. 6B. The fiber assembly 665 may include a core 668 that may include a pusher wire 669 with a guide member 670, such as a spherical-shaped plastic tip formed thereon. Other types of guide members 670 may be used. This core 668 provides the stiffness and guiding capability in order to thread the fiber assembly 665 into the channels 635.

Optical fibers 636A, 636B, 636C are shown bundled around the pusher wire 669, with the terminal ends of the optical fibers 636A, 636B, 636C being staggered along a length of the fiber assembly 665. Heat shrink tubing 672 (shown dotted) may be used to secure the components of the fiber assembly 665 together. Other means, such as a suitable adhesive, may be used for bundling together the fiber assembly 665.

The pusher wire 669 may be made of a high temperature alloy, such as Inconel 600, suitable for operation at high temperature (e.g., about 650° C.). The pusher wire 669 may be gold plated, so to reflect laser energy back to the surrounding ceramic material of the ceramic plate.

In one or more embodiments, the optical fibers 636A, 636B, 636C of the fiber assembly 665 may include angled cleaves (e.g. 45 degrees) so the laser energy fires off to a side. The direction that the angled cleave of the optical fibers 636A, 636B, 636C point may not be controlled. Each individual optical fiber 636A, 636B, 636C may point up, down, or to the side. Three optical fibers (e.g., fiber 636A, 636B, 636C) are shown in the depicted embodiment. However, about two to about fifty optical fibers, or even two to a hundred may be included in each fiber assembly 665. About five to about twenty optical fibers may be preferable in each fiber assembly 665.

Figure 7A:
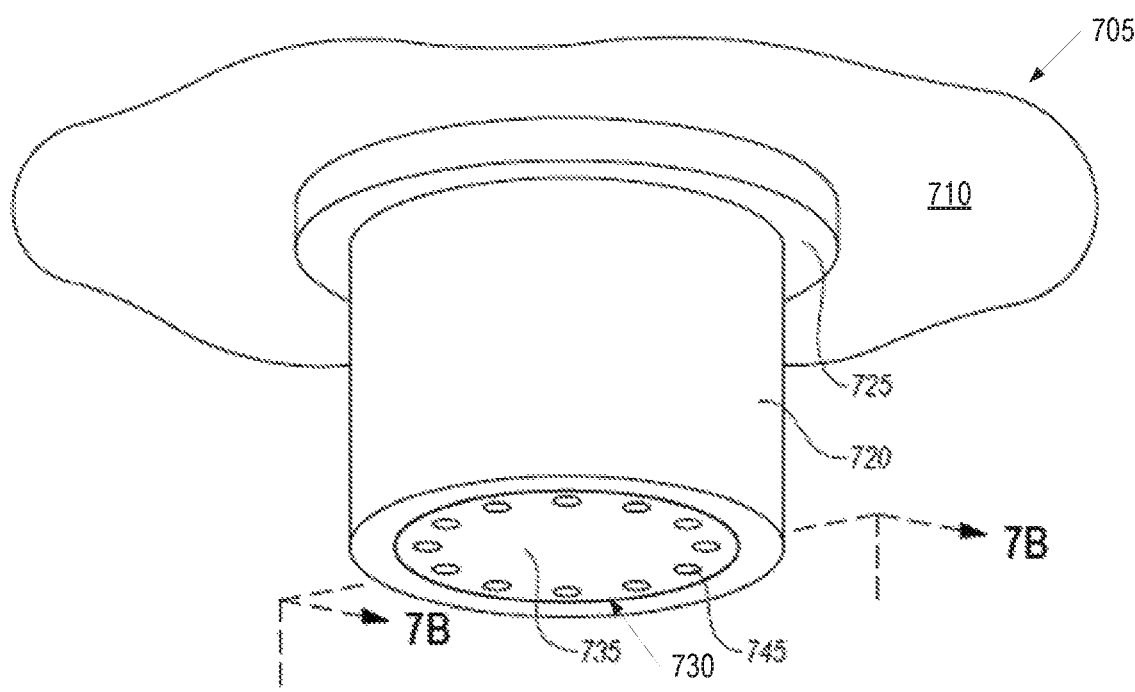
FIG. 7A illustrates a perspective view of one embodiment of a ceramic shaft and fiber guide.
Figure 7B:
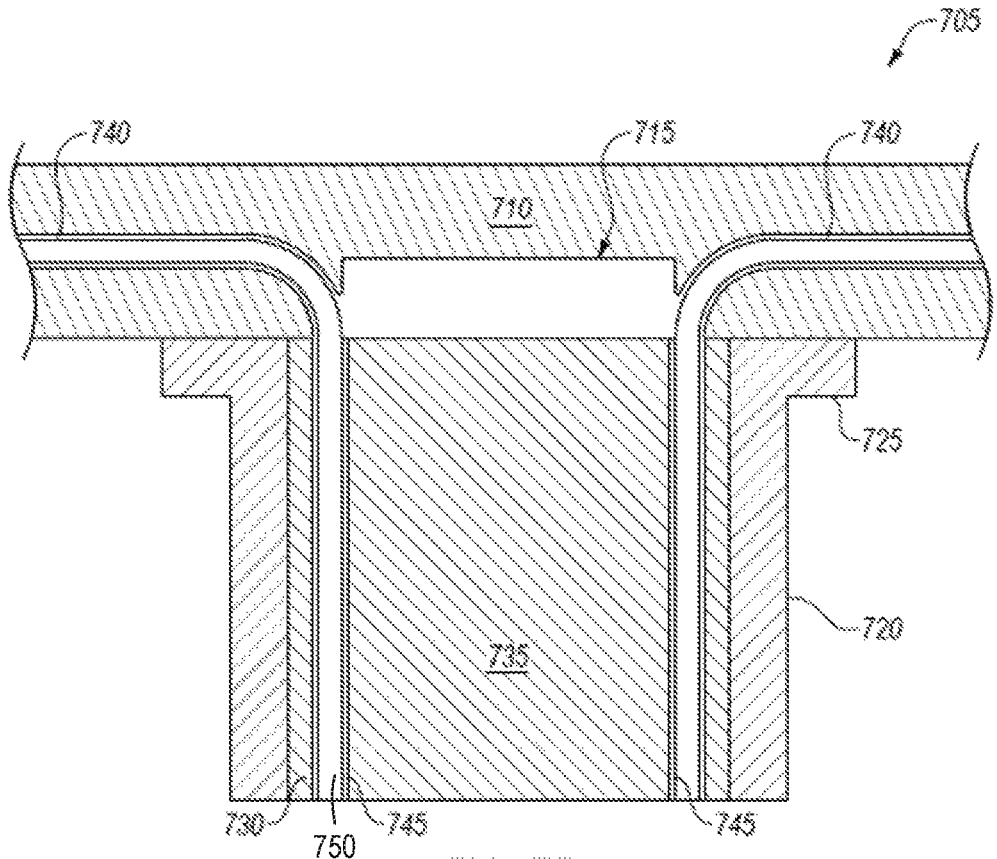
FIG. 7B illustrates a cross sectional side view of the ceramic shaft and fiber guide of FIG. 7A.

FIG. 7A illustrates a perspective view of one embodiment of a ceramic shaft 720 and fiber guide 735 for a substrate support assembly 705. FIG. 7B illustrates a cross sectional side view of the substrate support assembly 705 of FIG. 7A, including the ceramic shaft 720 and fiber guide 735. FIG. 7B may correspond to a cross section taken at line 7B-7B of FIG. 7A. The substrate support assembly 705 may correspond to substrate support assembly 130 of FIGS. 1-2 in embodiments.

The substrate support assembly 705 includes a ceramic plate 710, a ceramic shaft 720 bonded to a bottom surface of the ceramic plate 710, and a fiber guide 735 inserted into a cavity 730 in the ceramic shaft 720. Multiple channels 740 are formed inside of the ceramic plate 710. A recess 715 or cavity may be formed on a bottom surface of the ceramic plate 710. The recess 715 may provide access to all of the channels 740 in the ceramic plate 710. Accordingly, the channels 740 may all terminate at the recess 715. In one embodiment, the recess 715 is a circular recess and is located at or near a center of the bottom surface of the ceramic plate 710. In one embodiment, the recess 715 is fully surrounded by the ceramic shaft 720.

The ceramic shaft 720 may have a lip 725 that has a larger diameter than a remainder of the ceramic shaft 720. The lip 725 may provide increased surface area for improved bonding with the ceramic plate 710 and may provide improved strength and stability. The ceramic shaft 720 may be a hollow shaft having a cavity 730 that may or may not have a similar diameter to a diameter of the recess 715. In one embodiment, the cavity 730 has a diameter of approximately 4 inches.

Fiber guide 735 is inserted into the cavity 730 in the ceramic shaft. The fiber guide may have a diameter of approximately 4 inches in one embodiment. Fiber guide 735 includes multiple channels 745, which may be holes drilled into the fiber guide 735. In one embodiment, each channel 745 is separated from a next channel 745 around a perimeter of the fiber guide by approximately 2 mm. For a fiber guide having a diameter of 4 inches, up to 150 channels may be formed having a spacing of 2 mm. The fiber guide 735 may be metal and may include multiple channels 745. The channels 745 may receive optical fibers 750 and guide the optical fibers 750 into channels 740 in the ceramic plate 710. In one embodiment, the fiber guide 735 includes the same number of channels 745 as the number of channels 740 in the ceramic plate 710. Each channel 745 may line up with a corresponding channel 740 in the ceramic plate 710. Channels 740 may extend laterally in the ceramic plate 710 and may be substantially parallel to a surface of the ceramic plate 710. Channels 745 may be substantially perpendicular to the surface of the ceramic plate 710.

Figure 8A:
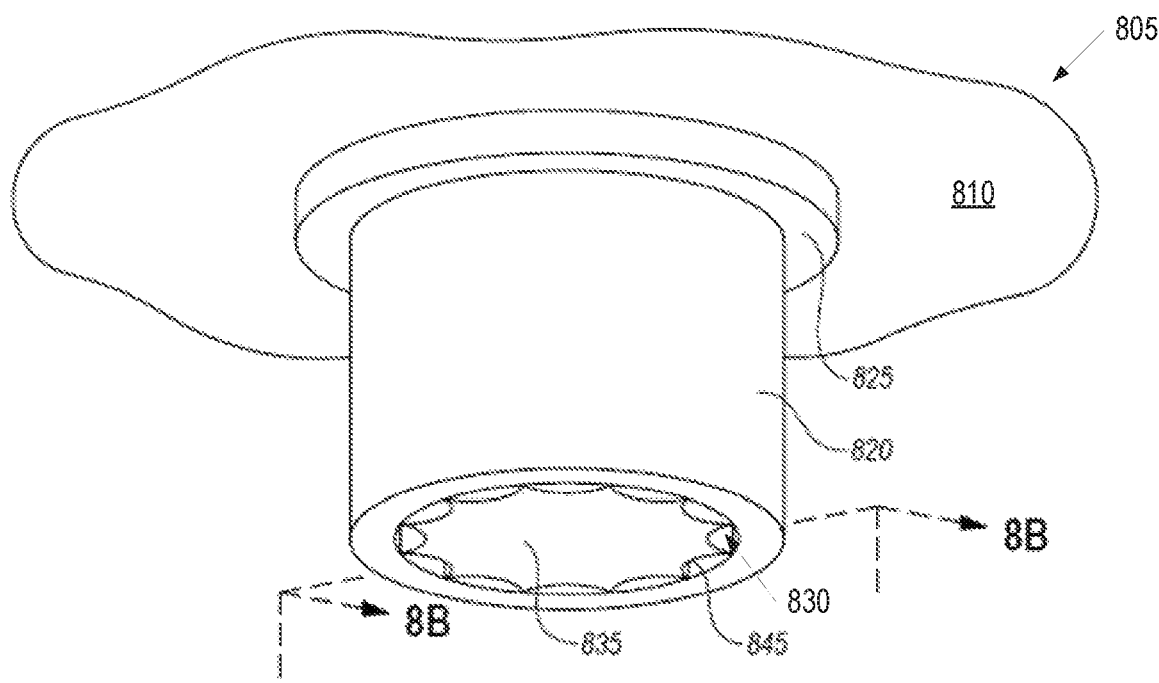
FIG. 8A illustrates a perspective view of another embodiment of a ceramic shaft and fiber guide.
Figure 8B:
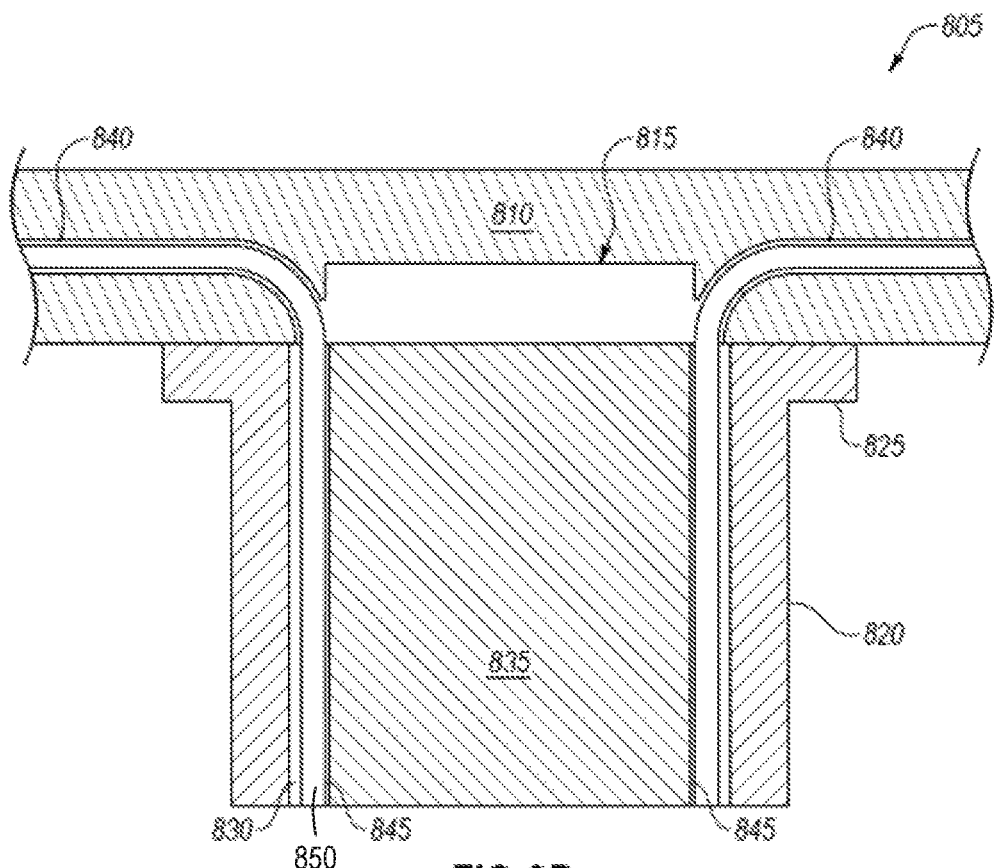
FIG. 8B illustrates a cross sectional side view of the ceramic shaft and fiber guide of FIG. 8A.

FIG. 8A illustrates a perspective view of one embodiment of a ceramic shaft 820 and fiber guide 835 for a substrate support assembly 805. FIG. 8B illustrates a cross sectional side view of the substrate support assembly 805 of FIG. 8A, including the ceramic shaft 820 and fiber guide 835. FIG. 8B may correspond to a cross section taken at line 8B-8B of FIG. 8A. The substrate support assembly 805 may correspond to substrate support assembly 130 of FIGS. 1-2 in embodiments.

The substrate support assembly 805 includes a ceramic plate 810, a ceramic shaft 820 bonded to a bottom surface of the ceramic plate 810, and a fiber guide 835 inserted into a cavity 830 in the ceramic shaft 820. Multiple channels 840 are formed inside of the ceramic plate 810. A recess 815 or cavity may be formed on a bottom surface of the ceramic plate 810. The recess 815 may provide access to all of the channels 840 in the ceramic plate 810. Accordingly, the channels 840 may all terminate at the recess 815. In one embodiment, the recess 815 is a circular recess and is located at or near a center of the bottom surface of the ceramic plate 810. In one embodiment, the recess 815 is fully surrounded by the ceramic shaft 820.

The ceramic shaft 820 may have a lip 825 that has a larger diameter than a remainder of the ceramic shaft 820. The lip 825 may provide increased surface area for improved bonding with the ceramic plate 810 and may provide improved strength and stability. The ceramic shaft 820 may be a hollow shaft having a cavity 830 that may or may not have a similar diameter to a diameter of the recess 815. In one embodiment, the cavity 830 has a diameter of approximately 4 inches.

Fiber guide 835 is inserted into the cavity 830 in the ceramic shaft. The fiber guide 835 may have a diameter of approximately 4 inches in one embodiment. Fiber guide 835 includes multiple channels 845, which may be grooves or ribs machined into the outer perimeter or wall of the fiber guide 835. In one embodiment, each channel 845 is separated from a next channel 845 around a perimeter of the fiber guide by approximately 2 mm. For a fiber guide having a diameter of 4 inches, up to 150 channels may be formed having a spacing of 2 mm. The fiber guide 835 may be metal and may include multiple channels 845. The channels 845 may receive optical fibers 850 and guide the optical fibers 850 into channels 840 in the ceramic plate 810. In one embodiment, the fiber guide 835 includes the same number of channels 845 as the number of channels 840 in the ceramic plate 810. Each channel 845 may line up with a corresponding channel 840 in the ceramic plate 810. Channels 840 may extend laterally in the ceramic plate 810 and may be substantially parallel to a surface of the ceramic plate 810. Channels 845 may be substantially perpendicular to the surface of the ceramic plate 810.

Figure 9:
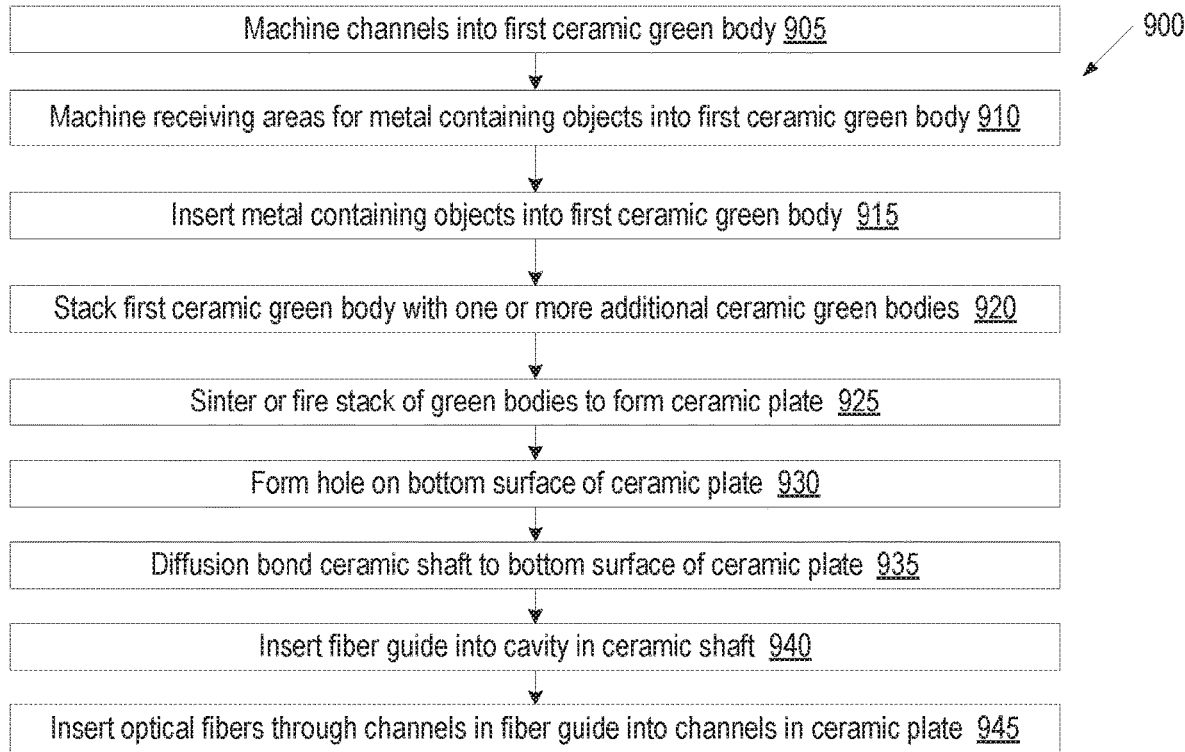
FIG. 9 illustrates a flowchart depicting a method of manufacturing a substrate support assembly that includes optical fibers for heating.

FIG. 9 illustrates a flowchart depicting a method 900 of manufacturing a substrate support assembly that includes optical fibers for heating. At block 905, channels may be machined into a first ceramic green body using any of the techniques described herein above. At block 910, receiving areas for metal containing objects may be machined into the first ceramic green body. At block 915, metal containing objects are interested into the first ceramic green body or are otherwise formed in the first ceramic green body (e.g., by screen printing). Alternatively, the metal containing objects may be formed on a second ceramic green body, such as by screen printing. If no metal containing objects or targets are to be used, then blocks 910 and 915 may be skipped.

At block 920, the first ceramic green body is stacked with one or more additional ceramic green bodies. The first ceramic green body, may be stacked over another ceramic green body for example. The other ceramic green body may include thermal elements such as resistive heating elements. Additionally, the first ceramic green body may be stacked under still one or more additional ceramic green bodies. These additional ceramic green bodies may have formed thereon electrodes (e.g., an RF mesh), and so on. Alternatively, a ceramic green body including the thermal elements may be positioned over the ceramic green body having the channels.

At block 925, the stack of ceramic green bodies is compressed and sintered or fired together to form a ceramic plate that has a monolithic body. The sintering process may be performed at temperatures of about 1500° C. or above. At block 930, a hole or recess is formed in a bottom surface of the ceramic plate. The hole may provide access to the channels formed in the ceramic plate.

At block 935, a ceramic shaft is diffusion bonded to the bottom surface of the ceramic plate. The ceramic shaft may be placed to surround the hole formed in the bottom surface of the ceramic plate. The diffusion bonding may be performed by compressing the ceramic shaft against the ceramic plate a temperatures of about 1500° C. or above.

In one embodiment, the ceramic shaft is a hollow shaft that has a central cavity. At block 940, a fiber guide may be inserted into the central cavity in the ceramic shaft. At block 945, optical fibers may be inserted through channels in the fiber guide and into the channels in the ceramic plate. The substrate support assembly may then be ready for use.

Figure 10:
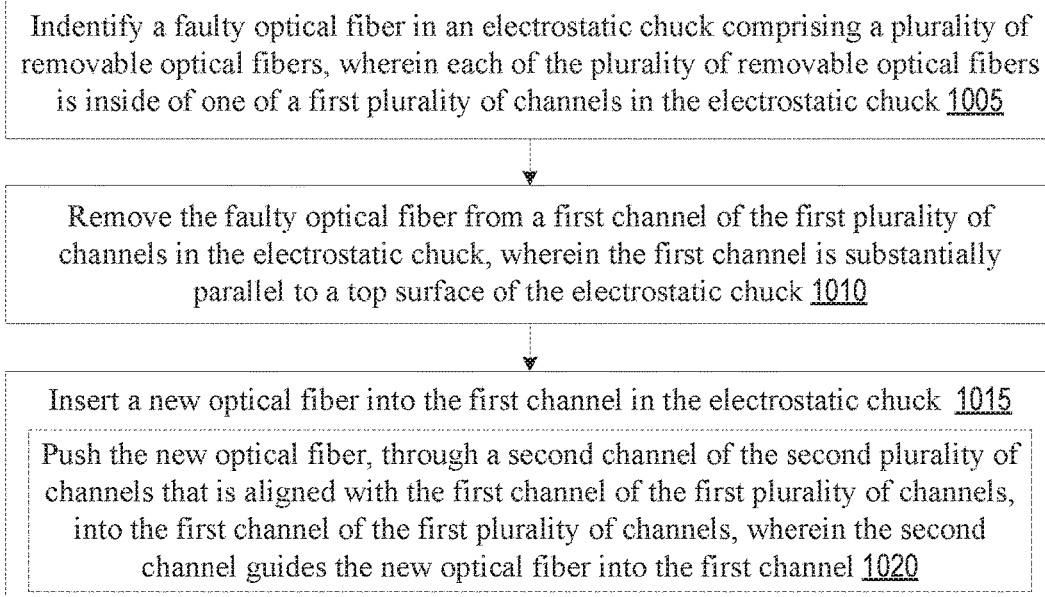
FIG. 10 illustrates a flowchart depicting a method of refurbishing a substrate support assembly that includes removable optical fibers.

FIG. 10 illustrates a flowchart depicting a method 1000 of refurbishing a substrate support assembly that includes removable optical fibers. At block 1005 of method 1000, a faulty optical fiber is identified in an electrostatic chuck comprising a plurality of removable optical fibers. Each of the plurality of removable optical fibers may be inside a first plurality of channels in the electrostatic chuck. The electrostatic chuck may be a ceramic plate of the substrate support assembly that includes a chucking electrode.

At block 1010, the faulty optical fiber is removed from a first channel of the first plurality of channels in the electrostatic chuck and a second channel of a ceramic shaft that is bonded to the electrostatic chuck. The second channel is one of a second plurality of channels in the ceramic shaft. The first channel may be substantially parallel to a top surface of the electrostatic chuck and the second channel may be substantially perpendicular to the top surface of the electrostatic chuck.

At block 1015, a new optical fiber is inserted into the first channel in the electrostatic chuck. In one embodiment, at block 1020 the new optical fiber is pushed through the second channel of the second plurality of channels that is aligned with the first channel of the first plurality of channels. The second channel guides the new optical fiber into the first channel. The electrostatic chuck of the substrate support assembly is then ready for use again.

A method of processing substrates, such as within an electronic device processing system (e.g., electronic device processing system 100) will be described briefly. The method includes providing a substrate support assembly (e.g., substrate support assembly 130) including a ceramic plate, a ceramic shaft, and a plurality of optical fibers (e.g., optical fibers 236, 636A, 636B, 636C) extending laterally in channels (e.g., channels 235, 535, 635). Optical fibers may be installed in channels after the substrate support assembly is manufactured.

The method further includes controlling light intensity provided to at least some of the plurality of optical fibers to accomplish light-based temperature control of the ceramic plate. Of course, temperature control of the ceramic plate also controls temperature of the substrate (e.g., substrate 240) that is in thermal contact therewith. In one or more embodiments, the method may further comprise heating the substrate support assembly by way of a coupled temperature unit (e.g., temperature unit 122) and thermal elements (e.g., thermal elements 242).

The method of controlling temperature of the substrate 240 may include providing temperature feedback, such as though the use of optical sensors (e.g., optical sensors) embedded in one or more of the channels 235, 535, 635. In some embodiments, large numbers of embedded optical sensors may be used. In others, model based control and a lesser number of temperature sensors may be employed. The control methodology for controlling the optical fibers 236 may be adjusted based on feedback from the process taking place in the process chamber (e.g., process chamber 106B), such as by measuring process results on the substrate 240.

The foregoing description discloses example embodiments of the invention. Modifications of the above-disclosed apparatus, systems, and methods which fall within the scope of the invention will be readily apparent to those of ordinary skill in the art. Accordingly, the present invention has been disclosed in connection with example embodiments, it should be understood that other embodiments may fall within the scope of the invention, as defined by the following claims.

What is claimed is:

1. A substrate support, comprising:
    a plate comprising:
        a top surface and a bottom surface, wherein the top surface is to support a substrate;
        an electrode;
        one or more resistive heating elements;
        a first plurality of channels;
        a recess formed at the bottom surface of the plate, wherein the recess is configured to provide access to each of the first plurality of channels; and
        a plurality of optical fibers in the first plurality of channels, wherein the recess is further configured to facilitate removal of one or more of the plurality of optical fibers from the substrate support, and wherein the plurality of optical fibers, in conjunction with the one or more resistive heating elements, control a temperature of one or more portions of the substrate to a target temperature; and
    a shaft bonded to the bottom surface of the plate, wherein the shaft surrounds the recess formed at the bottom surface of the plate.

2. The substrate support of claim 1, wherein the shaft comprises a cavity, and wherein a size of the cavity corresponds to a size of the recess and a shape of the cavity corresponds to a shape of the recess.

3. The substrate support of claim 1, wherein the plate is a ceramic plate and the shaft is a ceramic shaft.

4. The substrate support of claim 1, wherein the plate is a metal plate and the shaft is a metal shaft.

5. The substrate support of claim 1, further comprising:
    a fiber guide inserted into a cavity of the shaft, the fiber guide comprising a second plurality of channels, wherein a second channel of the second plurality of channels is to guide a first optical fiber of the plurality of optical fibers into a first channel of the first plurality of channels.

6. The substrate support of claim 5, wherein the fiber guide comprises metal and has a cylindrical shape.

7. The substrate support of claim 5, wherein the second plurality of channels comprises a plurality of grooves in an outer wall of the fiber guide.

8. The substrate support of claim 1, wherein the shaft comprises a second plurality of channels, wherein a second channel of the second plurality of channels is to guide a first optical fiber of the plurality of optical fibers into a first channel of the first plurality of channels.

9. The substrate support of claim 1, wherein the plate is a ceramic plate, further comprising:
    a plurality of metal containing objects in the ceramic plate, wherein a first metal containing object of the plurality of metal containing objects is positioned at an end of a first channel of the first plurality of channels, wherein the first metal containing object is to absorb photons delivered by a first optical fiber of the plurality of optical fibers.

10. The substrate support of claim 9, wherein the first metal containing object comprises a metal ceramic mixture at the end of the first channel.

11. The substrate support of claim 9, wherein the first metal containing object comprises a metal insert that is separated from the end of the first channel by a portion of the ceramic plate.

12. The substrate support of claim 9, wherein the plurality of metal containing objects comprise at least one of tungsten or molybdenum.

13. The substrate support of claim 1, wherein the one or more resistive heating elements are to provide a first level of temperature control of the plate, and wherein the plurality of optical fibers are to provide a second level of temperature control of the plate.

14. The substrate support of claim 1, wherein the first plurality of channels are parallel to the top surface.

15. The substrate support of claim 1, wherein at least one optical fiber of the plurality of optical fibers is a component of a fiber optic temperature sensor that is to measure a temperature at a region of the plate.

16. The substrate support of claim 15, wherein the at least one optical fiber is to be used both for heating and for temperature measurement.

17. A substrate support assembly, comprising:

a ceramic plate comprising a top surface and a bottom surface, wherein the top surface is to support a substrate, the ceramic plate further comprising one or more resistive heating elements, a first plurality of channels for receiving a plurality of optical fibers, and a recess formed at the bottom surface, wherein the recess is configured to provide each of the plurality of optical fibers with access to a channel of the first plurality of channels and the recess is configured to facilitate removal of one or more of the plurality of optical fibers from the substrate support assembly, wherein the plurality of optical fibers, in conjunction with the one or more resistive heating elements, control a temperature of one or more portions of the substrate to a target temperature; and a ceramic shaft bonded to the bottom surface of the ceramic plate, wherein the ceramic shaft surrounds the recess formed at the bottom surface of the ceramic plate, and wherein the ceramic shaft comprises a cavity; and a fiber guide inserted into the cavity of the ceramic shaft, the fiber guide comprising a second plurality of channels, wherein a second channel of the second plurality of channels is to guide a first optical fiber of the plurality of optical fibers into a first channel of the first plurality of channels.

18. The substrate support assembly of claim 17, wherein a) the ceramic plate comprises AlN and the ceramic shaft comprises AlN or b) the ceramic plate comprises $Al_2O_3$ and the ceramic shaft comprises $Al_2O_3$, the substrate support assembly further comprising a plurality of metal containing objects in the ceramic plate, wherein a first metal containing object of the plurality of metal containing objects is positioned at an end of the first channel, wherein the first metal containing object is to absorb photons delivered by the optical fiber.

* * * * *